(12) United States Patent
Nomura (10) Patent No.: US 9,201,101 B2
(45) Date of Patent: Dec. 1, 2015

(54) CURRENT SENSOR

(71) Applicant: ALPS GREEN DEVICES CO., LTD., Tokyo (JP)

(72) Inventor: Masatoshi Nomura, Miyagi-ken (JP)

(73) Assignee: ALPS GREEN DEVICES CO., LTD., Tokyo (JP)

(\*) Notice: Subject to any disclaimer, the term of this patent is extended or adjusted under 35 U.S.C. 154(b) by 211 days.

(21) Appl. No.: 14/109,691

(22) Filed: Dec. 17, 2013

(65) Prior Publication Data

US 2014/0103918 A1  Apr. 17, 2014

Related U.S. Application Data

(63) Continuation of application No. PCT/JP2012/065123, filed on Jun. 13, 2012.

(30) Foreign Application Priority Data

Jul. 5, 2011 (JP) ................................. 2011-149024

(51) Int. Cl.
| | |
|---|---|
| G01R 33/02 | (2006.01) |
| G01R 19/00 | (2006.01) |
| G01V 3/08 | (2006.01) |
| G01D 5/12 | (2006.01) |
| G01R 15/20 | (2006.01) |

(52) U.S. Cl.
CPC .......... *G01R 19/0092* (2013.01); *G01R 15/205* (2013.01); *G01V 3/08* (2013.01); *G01D 5/12* (2013.01); *G01R 15/207* (2013.01)

(58) Field of Classification Search
CPC .................................... G01V 3/08; G01D 5/12
USPC .................................... 324/244, 117 R, 117 H
See application file for complete search history.

(56) References Cited

U.S. PATENT DOCUMENTS

| | | | |
|---|---|---|---|
| 8,878,520 B2 * | 11/2014 | Tamura | ...................... 324/117 R |
| 8,952,687 B2 * | 2/2015 | Tamura | .......................... 324/244 |
| 9,063,185 B2 * | 6/2015 | Hebiguchi | |

FOREIGN PATENT DOCUMENTS

| | | |
|---|---|---|
| JP | 2010-19747 | 1/2010 |
| JP | 2011-39021 | 2/2011 |

OTHER PUBLICATIONS

Search Report dated Jul. 10, 2012 from International Application No. PCT/JP2012/065123.

\* cited by examiner

*Primary Examiner* — Reena Aurora
(74) *Attorney, Agent, or Firm* — Beyer Law Group LLP (57) ABSTRACT

A current sensor includes a first current path, a second current path disposed parallel to the first current path, and a pair of first magnetic sensors. The first current path has a pair of main surfaces and includes a plate-shaped first region. The second current path has a pair of main surfaces and includes a plate-shaped second region. The first magnetic sensors are arranged on the respective main surfaces in the first region such that sensing axes of the first magnetic sensors are parallel to the respective main surfaces in the first region. The first magnetic sensors are configured to sense a magnetic field generated by a target current flowing through the first region. The second region is placed such that the main surfaces in the second region are perpendicular to the sensing axes of the first magnetic sensors.

6 Claims, 7 Drawing Sheets

FIG. 1

CURRENT FLOWING DIRECTION

CURRENT SENSOR

CLAIM OF PRIORITY

This application is a Continuation of International Application No. PCT/JP2012/065123 filed on Jun. 13, 2012, which claims benefit of Japanese Patent Application No. 2011-149024 filed on Jul. 5, 2011. The entire contents of each application noted above are hereby incorporated by reference.

BACKGROUND OF THE INVENTION

1. Field of the Invention

The present invention relates to a current sensor to measure the magnitude of current.

2. Description of the Related Art

Current sensors capable of measuring a large current in a contactless manner have recently been demanded. Such current sensors in practical use include a current sensor which measures a current to be measured (hereinafter, referred to as a "target current") flowing through a current path (hereinafter, referred to as a "target current path") by detecting a change in magnetic field generated by the target current through a magnetic sensor disposed near the target current path.

This sensor is configured such that multiple long current paths extending in a specific direction are arranged parallel to each other and a magnetic sensor is provided for each current path. Accordingly, the magnetic sensor provided for a target current path may be affected by a magnetic field generated by another current (adjacent current) flowing through a current path (adjacent current path) adjacent to the target current path. Disadvantageously, the accuracy of measurement of a target current may be reduced. To prevent the accuracy of target current measurement from being reduced due to the effect of a magnetic field from an adjacent current path, current sensors recently developed are configured as follows: Each magnetic sensor is positioned such that a magnetic field generated by a target current is oriented along a sensing axis of the magnetic sensor and a magnetic field generated by an adjacent current is orthogonal to the sensing axis (refer to, for example, U.S. Patent Application Publication No. 2009/0121704 and Japanese Unexamined Patent Application Publication No. 2010-019747).

In the above-described current sensors, since each magnetic sensor has to be positioned such that a magnetic field generated by a target current is oriented along the sensing axis and a magnetic field generated by an adjacent current is orthogonal thereto, extremely highly accurate positioning of the magnetic sensor is required. Furthermore, since the magnetic sensor has to be tilted from a direction perpendicular to a main surface of a target current path such that the orientation of the magnetic field generated by the adjacent current is orthogonal to the sensing axis, extremely highly accurate mounting of the magnetic sensor is also required. The above-described current sensors therefore require highly accurate positioning and mounting of the magnetic sensors in order to prevent the accuracy of measurement of a target current from being reduced due to the effect of a magnetic field generated by an adjacent current.

SUMMARY OF THE INVENTION

The present invention has been made in consideration of the above-described disadvantages and provides a current sensor capable of measuring a target current with accuracy while reducing the effect of a magnetic field generated by an adjacent current without requiring extremely highly accurate positioning and mounting of magnetic sensors.

The present invention provides a current sensor including a first current path having a pair of main surfaces and including a first region and a third region each having a plate-like shape, a second current path disposed parallel to the first current path, the second current path having a pair of main surfaces and including a second region and a fourth region each having a plate-like shape, a pair of first magnetic sensors arranged on the respective main surfaces in the first region such that sensing axes of the first magnetic sensors are parallel to the respective main surfaces in the first region and are parallel to each other, the first magnetic sensors being configured to sense a magnetic field generated by a target current flowing through the first region, and a pair of second magnetic sensors arranged on the respective main surfaces in the fourth region such that sensing axes of the second magnetic sensors are parallel to the respective main surfaces in the fourth region and are parallel to each other, the second magnetic sensors being configured to sense a magnetic field generated by a target current flowing through the fourth region. The second region is placed such that the main surfaces in the second region are perpendicular to the sensing axes of the first magnetic sensors. The third region is placed such that the main surfaces in the third region are perpendicular to the sensing axes of the second magnetic sensors. The first current path is twisted between the first region and the third region. The second current path is twisted between the second region and the fourth region.

In the above-described configuration, since the second region of the second current path is placed such that the main surfaces in the second region are perpendicular to the sensing axes of the first magnetic sensors, a magnetic field (magnetic flux) generated by an adjacent current flowing through the second region passes through the first magnetic sensors in a direction orthogonal to the sensing axes of the first magnetic sensors. Accordingly, the first magnetic sensors do not sense the magnetic field generated by the adjacent current. Consequently, the current sensor can measure the target current flowing through the first current path without being affected by the magnetic field from the second current path adjacent to the first current path. Furthermore, since the first magnetic sensors are arranged on the respective main surfaces in the first region such that the sensing axes of the first magnetic sensors are parallel to the respective main surfaces in the first region, extremely highly accurate positioning and mounting of the first magnetic sensors is not required. Advantageously, the accuracy of measurement of the target current flowing through the first current path can be prevented from being reduced due to the effect of the magnetic field from the adjacent second current path without requiring extremely highly accurate positioning and mounting of the first magnetic sensors. Additionally, since the sensing axes of the pair of magnetic sensors are parallel to each other, a disturbance magnetic field, such as the geomagnetic field, applied to the magnetic sensors in the same direction can be canceled by obtaining a differential output of the magnetic sensors.

In the above-described configuration, since the third region of the first current path is placed such that the main surfaces in the third region are perpendicular to the sensing axes of the second magnetic sensors, a magnetic field (magnetic flux) generated by an adjacent current flowing through the third region passes through the second magnetic sensors in a direction orthogonal to the sensing axes of the second magnetic sensors. Accordingly, the second magnetic sensors do not sense the magnetic field generated by the adjacent current. Consequently, the current sensor can measure the target current flowing through the second current path without being affected by the magnetic field from the adjacent first current path. Furthermore, since the second magnetic sensors are arranged on the respective main surfaces in the fourth region such that the sensing axes of the second magnetic sensors are parallel to the respective main surfaces in the fourth region, extremely highly accurate positioning and mounting of the second magnetic sensors is not required. Advantageously, the accuracy of measurement of the target current flowing through the second current path can be prevented from being reduced due to the effect of the magnetic field from the adjacent first current path without requiring extremely highly accurate positioning and mounting of the second magnetic sensors. Additionally, since the sensing axes of the pair of magnetic sensors are parallel to each other, a disturbance magnetic field, such as the geomagnetic field, applied to the magnetic sensors in the same direction can be canceled by obtaining a differential output of the magnetic sensors.

In the current sensor, the second region may have a width greater than a distance between the first magnetic sensors. In this configuration, since the magnetic field generated by an adjacent current can be applied to the magnetic sensors in the direction perpendicular to the sensing axes of the magnetic sensors, the effect of the magnetic field generated by the adjacent current can be more efficiently reduced.

In the current sensor, the third region may have a width greater than a distance between the second magnetic sensors. In this configuration, since the magnetic field generated by an adjacent current can be applied to the magnetic sensors in the direction perpendicular to the sensing axes of the magnetic sensors, the effect of the magnetic field generated by the adjacent current can be more efficiently reduced.

In the current sensor, the main surfaces of the first and second current paths may be parallel to one another at a mounting position.

In the current sensor, preferably, the first current path is twisted such that the main surfaces in the third region are oriented at 90° relative to the main surfaces in the first region, and the second current path is twisted such that the main surfaces in the fourth region are oriented at 90° relative to the main surfaces in the second region.

In this configuration, the main surfaces in the two regions (the first and third regions or the second and fourth regions) in the extending direction (current flowing direction) of each currant path have a twisted relation. Since each current path includes a twisted portion as described above, the second region is placed such that the main surfaces in the second region are perpendicular to the sensing axes of the first magnetic sensors and the third region is placed such that the main surfaces in the third region are perpendicular to the sensing axes of the second magnetic sensors. Furthermore, when the first and second current paths are mounted on another member, the main surfaces of the first and second current paths can be arranged parallel to one another at a mounting position. This facilitates mounting of the current sensor with the above-described configuration on another member.

In the current sensor, the second current path may be one of two second current paths arranged with the first current path therebetween. The main surfaces in the second regions of the second current paths may be arranged so as to face each other across the first region of the first current path. The main surfaces in the fourth regions of the second current paths may be arranged so as to be flush with each other with the third region of the first current path between the main surfaces in the fourth regions.

In this configuration, in cases where the current sensor includes three current paths (one first current path and two second current paths), the current sensor can accurately measure a target current without being affected by the magnetic field from the adjacent first or second current path.

DESCRIPTION OF THE PREFERRED EMBODIMENTS

In a current sensor including magnetic sensors arranged on a device, such as a three-phase motor, including long current paths which extend in a specific direction and are arranged so as to extend parallel to each other, the magnetic sensor disposed on each current path senses a magnetic field generated by a target current flowing through the current path and senses part of a magnetic field generated by an adjacent current flowing through an adjacent current path next to the current path. Accordingly, the effect of the magnetic field generated by the adjacent current interferes with accurate measurement of the target current.

Figure 6A:
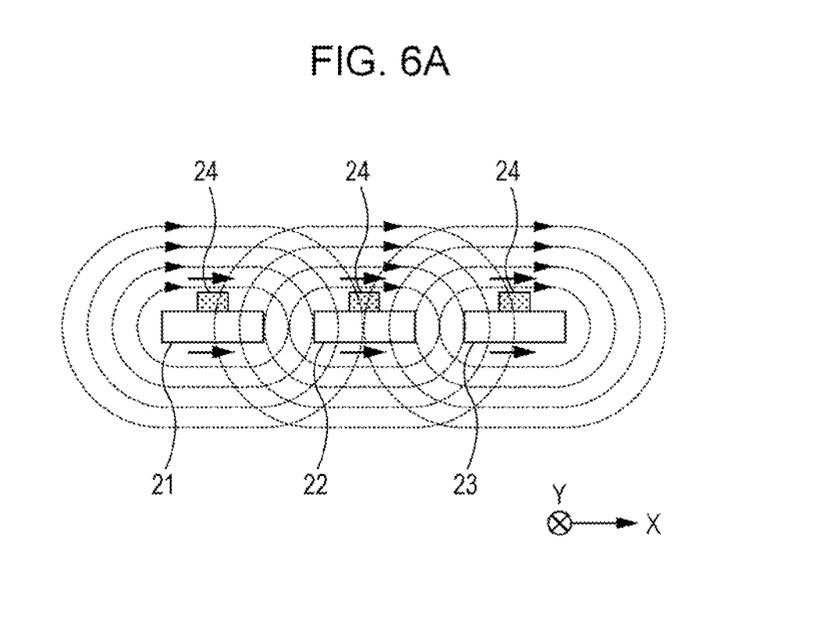
FIGS. 6A and 6B are cross-sectional views illustrating an example of a related-art current sensor.
Figure 6B:
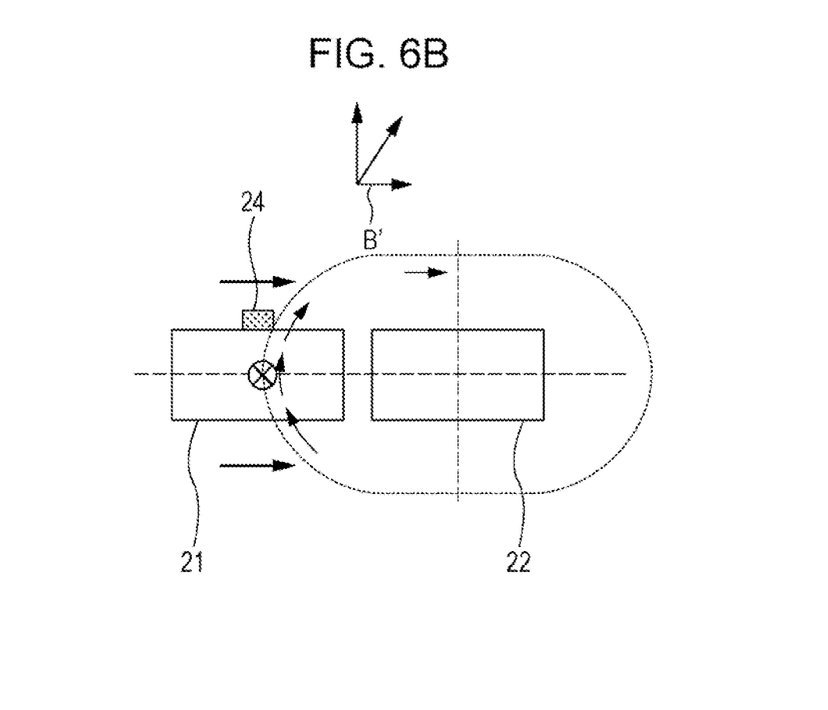

FIGS. 6A and 6B illustrate a current sensor including three long current paths (plate-shaped conductors, or bus bars) which extend in a specific direction and are arranged parallel to one another, and magnetic sensors arranged on the respective current paths. FIG. 6A is a cross-sectional view of the current sensor and FIG. 6B is an enlarged cross-sectional view of part of the current sensor. In the current sensor, the three bus bars, indicated at 21 to 23, are arranged so as to extend in a direction into the page of FIG. 6A. In addition, the bus bars 21 to 23 are arranged side by side such that respective main surfaces are flush with one another. A target current flows through each of the bus bars 21 to 23 in the direction into the page of FIG. 6A. The flow of target currents through the bus bars 21 to 23 induces, or generates magnetic fields in a direction indicated by dotted lines as illustrated in FIG. 6A.

The magnetic sensor, indicated at 24, is disposed on one of main surfaces of each of the bus bars 21 to 23. The magnetic sensor 24 has a sensing axis that is parallel to the main surfaces of each of the bus bars 21 to 23 and that is orthogonal to the direction (hereinafter, referred to as the "current flowing direction") in which the target currents flow. In the following description, it is assumed that the bus bar 21 is a target current path and the bus bar 22 is an adjacent current path.

In the arrangement of FIG. 6A, a magnetic field generated by an adjacent current flowing through the bus bar 22 is applied at an angle with respect to a direction perpendicular to the sensing axis of the magnetic sensor 24 on the main surface of the bus bar 21. As illustrated in FIG. 6B, therefore, the magnetic sensor 24 detects a vector component B' that is parallel to the sensing axis of the magnetic sensor 24. Accordingly, the magnetic sensor 24 senses the magnetic field generated by the target current flowing through the bus bar 21 and the magnetic field generated by the adjacent current. Unfortunately, the effect of the magnetic field generated by the adjacent current interferes with accurate measurement of the target current.

The inventor has focused on the above-described fact that the magnetic field generated by the adjacent current flowing through the bus bar 22 is applied at an angle with respect to the direction perpendicular to the sensing axis of the magnetic sensor 24 in the arrangement of FIG. 6A. After diligent study of the arrangement relation between the bus bars 21 and 22, the inventor has found that when the main surfaces of the plate-shaped bus bar 22 are perpendicular to the sensing axis of the magnetic sensor 24, the magnetic field generated by the adjacent current flowing through the bus bar 22 is applied in the direction perpendicular to the sensing axis of the magnetic sensor 24, thus leading to the present invention.

An essential feature of the present invention is that a magnetic sensor is disposed on a main surface of a plate-shaped target current path such that a sensing axis of the magnetic sensor is oriented parallel to an in-plane direction of a flat region of the target current path, a plate-shaped adjacent current path through which an adjacent current flows is disposed such that an in-plane direction of a flat region of the adjacent current path is perpendicular to the sensing axis of the magnetic sensor, and the above-described arrangement achieves accurate measurement of a target current without requiring extremely highly accurate positioning and mounting of the magnetic sensor.

An embodiment of the present invention will be described below in detail with reference to the drawings.

Figure 1:
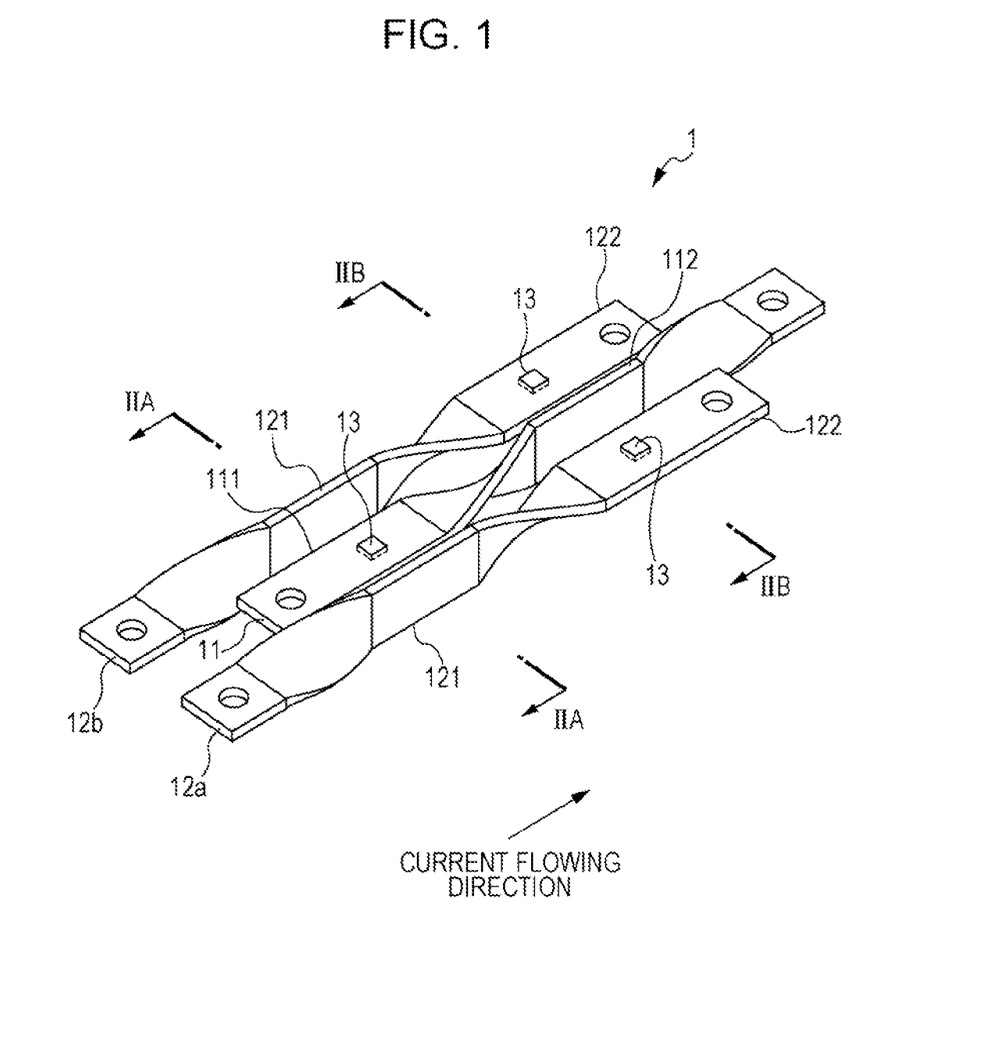
FIG. 1 is a schematic perspective view of a current sensor according to an embodiment.
Figure 2A:
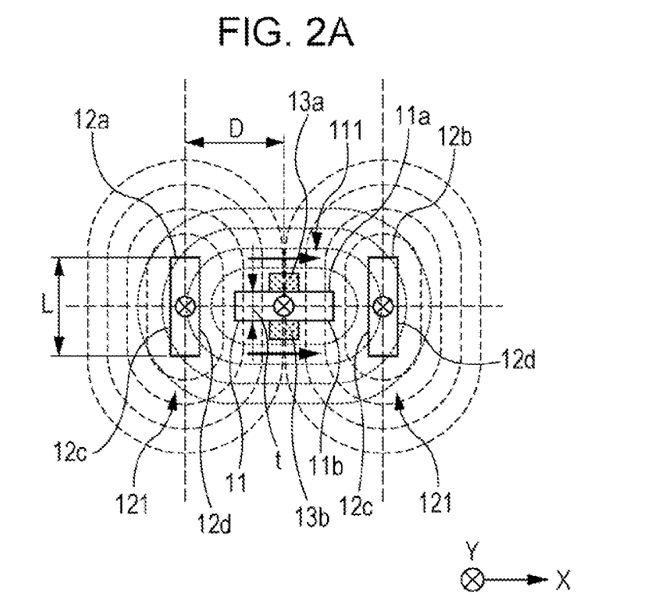
FIGS. 2A and 2B are cross-sectional views of the current sensor according to the embodiment.
Figure 2B:
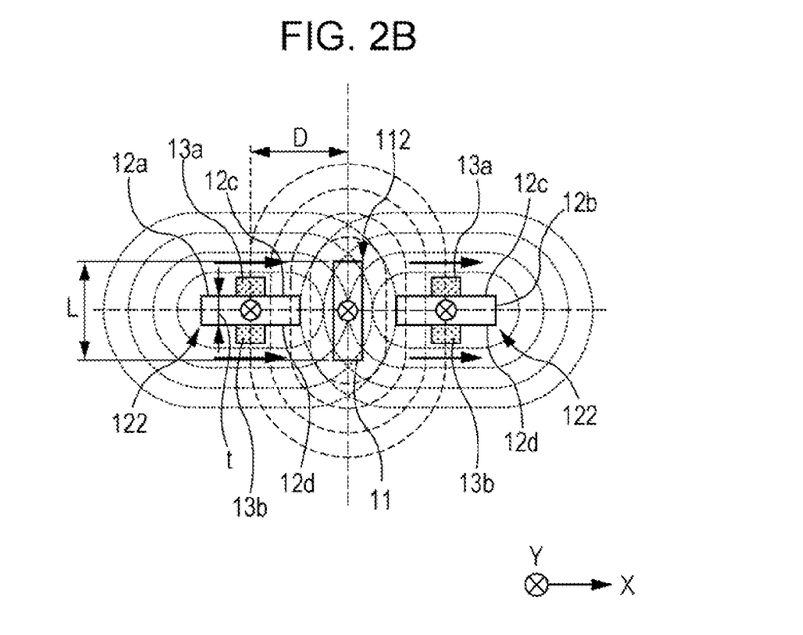

FIG. 1 is a schematic perspective view of a current sensor 1 according to the present embodiment. FIG. 2A is a cross-sectional view of the current sensor 1 taken along line IIA-IIA in FIG. 1. FIG. 2B is a cross-sectional view of the current sensor 1 taken along line IIB-IIB in FIG. 1. As illustrated in FIG. 1, the current sensor 1 includes three current paths, i.e., a bus bar 11 (first current path) and bus bars 12a and 12b (second current paths). The bus bars 11, 12a, and 12b are long plate-shaped conductors extending in a specific direction and are arranged parallel to one another.

Referring to FIG. 2A, the bus bar 11 has a pair of main surfaces 11a and 11b which are parallel to each other. Magnetic sensors 13a and 13b are arranged on the main surfaces 11a and 11b, respectively. As illustrated in FIG. 2A, the pair of magnetic sensors 13a and 13b have sensing axes which are parallel to the main surfaces 11a and 11b of the bus bar 11, respectively, and are parallel to each other. In FIG. 2A, a region including parts on which the magnetic sensors 13 are arranged in the bus bar 11 corresponds to a first region 111 having a plate-like shape in the present invention. The first region 111 includes at least positions where the magnetic sensors 13 are arranged in the bus bar 11. The bus bars 12a and 12b each have a pair of main surfaces 12c and 12d which are parallel to each other. The magnetic sensors 13a and 13b are arranged on the main surfaces 12c and 12d, respectively. As illustrated in FIG. 2B, the pair of magnetic sensors 13a and 13b have sensing axes which are parallel to the main surfaces 12c and 12d of each of the bus bars 12a and 12b, respectively, and which are oriented (in the X direction in FIGS. 2A and 2B) perpendicular to a current flowing direction (Y direction in FIGS. 2A and 2B) in which current flows through the bus bars 11, 12a, and 12b. Additionally, the sensing axes of the magnetic sensors 13a and 13b are parallel to each other. In FIG. 2B, a region including a portion on which the magnetic sensors 13a and 13b are arranged in each of the bus bars 12a and 12b corresponds to a fourth region 122 having a plate-like shape in the present invention. The fourth region 122 includes at least the positions of the magnetic sensors 13a and 13b arranged in each of the bus bars 12a and 12b.

As illustrated in FIG. 2A, a plate-shaped second region 121 of the bus bar 12a is disposed so as to face one end of the first region 111 such that the second region 121 is placed at substantially the same position as that of the magnetic sensors 13a and 13b arranged on the bus bar 11 in the current flowing direction of a target current (Y direction in FIG. 2A). This second region 121 includes at least a portion of the bus bar 12a corresponding to the positions of the magnetic sensors 13a and 13b arranged on the bus bar 11 in the current flowing direction. Similarly, a plate-shaped second region 121 of the bus bar 12b is disposed so as to face the other end of the first region 111 such that the second region 121 is placed at substantially the same position as that of the magnetic sensors 13a and 13b arranged on the bus bar 11 in the current flowing direction of the target current (Y direction in FIG. 2A). This second region 121 includes at least a portion of the bus bar 12b corresponding to the positions of the magnetic sensors 13a and 13b arranged on the bus bar 11 in the current flowing direction.

As illustrated in FIG. 2B, a plate-shaped third region 112 of the bus bar 11 is disposed so as to face one end of the fourth region 122 of the bus bar 12a such that the fourth region 122 is placed at substantially the same position as that of the magnetic sensors 13a and 13b arranged on the bus bar 12a in the current flowing direction of a target current (Y direction in FIG. 2B). The third region 112 includes at least a portion of the bus bar 11 corresponding to the positions of the magnetic sensors 13a and 13b arranged on the bus bar 12a in the current flowing direction. Similarly, the plate-shaped third region 112 of the bus bar 11 is disposed so as to face one end of the fourth region 122 of the bus bar 12b such that the third region 112 is placed at substantially the same position as that of the magnetic sensors 13a and 13b arranged on the bus bar 12b in the current flowing direction of the target current (the Y direction in FIG. 2B).

The first, second, third, and fourth regions 111, 121, 112, and 122 are arranged such that the main surfaces in the first region 111 (or an in-plane direction in this flat region) of the bus bar 11 are perpendicular to the main surfaces in the second regions 121 (or an in-plane direction in these flat regions) of the bus bars 12a and 12b and the main surfaces in the fourth regions 122 (or an in-plane direction in these flat regions) of the bus bars 12a and 12b are perpendicular to the main surfaces in the third region 112 (or an in-plane direction in this flat region) of the bus bar 11. Specifically, the second regions 121 of the bus bars 12a and 12b are arranged such that the main surfaces in the second regions 121 are perpendicular to the sensing axes of the magnetic sensors 13a and 13b and the third region 112 of the bus bar 11 is disposed such that the main surfaces in the third region 112 are perpendicular to the sensing axes of the magnetic sensors 13a and 13b.

To achieve the above-described arrangement of the first, second, third, and fourth regions 111, 121, 112, and 122, the bus bar 11 is twisted between the first region 111 and the third region 112 such that the main surfaces in the third region 112 are oriented at 90° relative to the main surfaces in the first region 111 and each of the bus bars 12a and 12b is twisted between the second region 121 and the fourth region 122 such that the main surfaces in the fourth region 122 are oriented at 90° relative to the main surfaces in the second region 121. In this arrangement, the bus bars 11, 12a, and 12b extend in a specific direction while being arranged parallel to one another, and the main surfaces in the two regions (the first and third regions 111 and 112 or the second and fourth regions 121 and 122) in the extending direction (current flowing direction) of each currant path have a twisted relation. Since each current path includes a twisted portion as described above, each second region 121 is disposed such that the main surfaces in the second region 121 are perpendicular to the sensing axes of the magnetic sensors 13a and 13b in the target current sensing region (the first region 111) and the third region 112 is disposed such that the main surfaces in the third region 112 are perpendicular to the sensing axes of the magnetic sensors 13a and 13b in each target current sensing region (the fourth region 122). Furthermore, when the bus bars 11, 12a, and 12b are mounted on another member, the main surfaces of the bus bars 11, 12a, and 12b can be arranged parallel to one another (or flush with one another) at a mounting position. This facilitates mounting of the current sensor, having the above-described configuration according to the present embodiment, on another member. Since the bus bar 11 is twisted in one direction between the first region 111 and the third region 112 and each of the bus bars 12a and 12b is twisted in a direction opposite to the twisting direction of the bus bar 11 between the second region 121 and the fourth region 122, the cross-sectional areas of the bus bars 11, 12a, and 12b are kept constant throughout their lengths, thus providing substantially uniform electrical resistance.

As described above, the current sensor has a first cross-sectional pattern and a second cross-sectional pattern such that these patterns are continuously repeated in the extending direction (current flowing direction) of the bus bars 11, 12a, and 12b. In the first cross-sectional pattern, as illustrated in FIG. 2A, the pair of magnetic sensors 13 are arranged on the respective main surfaces 11a and 11b of the bus bar 11 and the sensing axes of the magnetic sensors 13 are parallel to the main surfaces 11a and 11b, perpendicular to the current flowing direction of the target current, and parallel to each other. The in-plane direction of the main surfaces 12c of the two bus bars 12a and 12b arranged on both sides of the bus bar 11 is perpendicular to the in-plane direction of the main surfaces 11a and 11b of the bus bar 11. In the second cross-sectional pattern, as illustrated in FIG. 2B, the pair of magnetic sensors 13 are arranged on the respective main surfaces 12c and 12d of each of the bus bars 12a and 12b and the sensing axes of the magnetic sensors 13 are parallel to the main surfaces 12c and 12d, perpendicular to the current flowing direction of the target current, and parallel to each other. The in-plane direction of the main surfaces 12c of the two bus bars 12a and 12b arranged on both the sides of the bus bar 11 is perpendicular to the in-plane direction of the main surfaces 11a and 11b of the bus bar 11. In the current sensor with the above-described configuration, preferably, the bus bars 12a and 12b are arranged with the bus bar 11 therebetween, the main surfaces 12c and 12d in the second regions 121 of the bus bars 12a and 12b face each other across the first region 111 of the bus bar 11, and the main surfaces 12c in the fourth regions 122 of the bus bars 12a and 12b are flush with each other with the third region 112 of the bus bar 11 between the main surfaces in the fourth regions 122. This configuration enables a target current to be accurately measured without being affected by a magnetic field generated by the adjacent bus bar 11, 12a, or 12b.

In the configuration, preferably, the width, indicated at L, of the second region 121 is greater than the distance, indicated at t, between the pair of magnetic sensors 13a and 13b (or the thickness of the bus bar 11) as illustrated in FIG. 2A. Preferably, the width L of the third region 112 is greater than the distance t between the pair of magnetic sensors 13a and 13b (or the thickness of each of the bus bars 12a and 12b) as illustrated in FIG. 2B. This configuration allows a magnetic field generated by an adjacent current to be applied to the magnetic sensors in a direction perpendicular to the sensing axes of the magnetic sensors 13. Accordingly, the effect of the magnetic field generated by the adjacent current can be efficiently reduced.

Furthermore, preferably, the distance, indicated at D, between each of the bus bars 12a and 12b and the magnetic sensors 13a and 13b (or the distance between the midsection of each of the bus bars 12a and 12b in a direction along the thickness thereof and the midsections of the magnetic sensors 13a and 13b) is less than the width L of the second region 121 and that of the third region 112 as much as possible. This configuration enables a magnetic field generated by an adjacent current to be perpendicular to the sensing axes of the magnetic sensors 13 in an area where magnetic field lines are more parallel to one another. Accordingly, the effect of the magnetic field generated by the adjacent current can be more reliably reduced.

Although the case where the bus bars, serving as plate-shaped conductors, are used as current paths has been described with reference to FIGS. 1, 2A, and 2B, any conductors other than the plate-shaped conductors may be used as current paths, so long as magnetic sensors are arranged on main surfaces such that sensing axes of the magnetic sensors are parallel to an in-plane direction of a flat region of a plate-shaped target current path, and a plate-shaped adjacent current path through which an adjacent current flows is disposed such that an in-plane direction of a flat region of the adjacent current path is perpendicular to the sensing axes of the magnetic sensors. For example, the current paths may have any cross-sectional shape other than a rectangle in regions other than the above-described flat regions.

The magnetic sensors 13 are configured to sense magnetic fields generated by target currents flowing through the first and fourth regions 111 and 122. As regards the magnetic sensors 13a and 13b, any magnetic sensor capable of achieving magnetic sensing may be used. For example, a magnetic sensor including a magnetoresistive element, such as a giant magnetoresistive (GMR) element or a tunneling magnetoresistive (TMR) element, or a magnetic sensor including a Hall element may be used as the magnetic sensors 13a and 13b. Among these elements, the magnetoresistive element is preferably used because the element can be formed such that its sensing axis is oriented parallel to the main surfaces in the flat region of each of the bus bars 11, 12a, and 12b.

Figure 3:
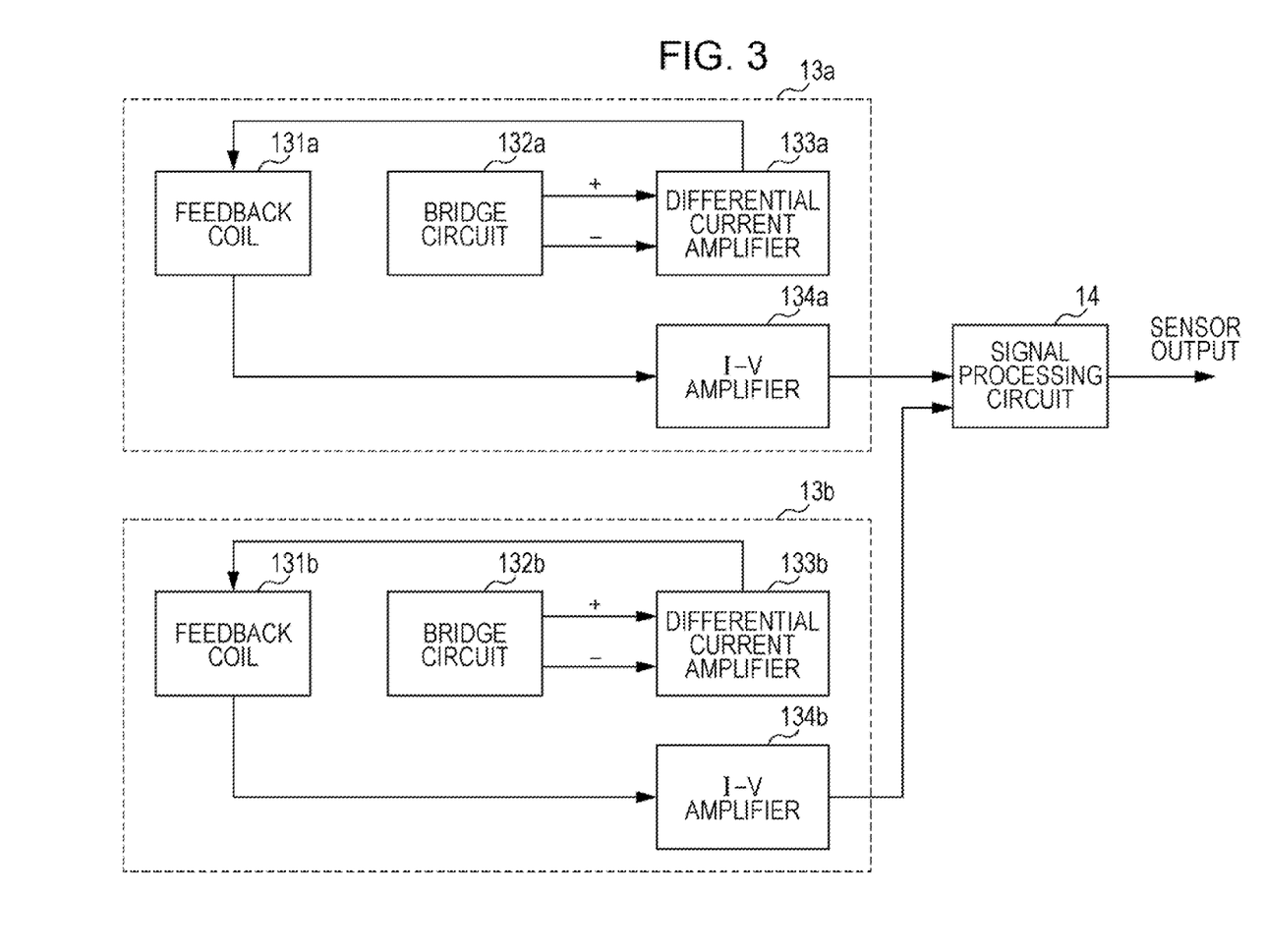
FIG. 3 is a circuit diagram illustrating an exemplary current sensor in accordance with the embodiment.

FIG. 3 is a circuit diagram of an exemplary current sensor in accordance with the embodiment of the present invention. In FIG. 3, the current sensor includes the pair of magnetic sensors 13a and 13b and a signal processing circuit 14 configured to process signals, indicating the result of sensing, from the magnetic sensors 13a and 13b to generate an output of the sensor. The magnetic sensor 13a includes a feedback coil 131a disposed so as to be capable of generating a magnetic field oriented so as to cancel an induced magnetic field generated by a target current, a bridge circuit 132a including a magnetoresistive element and a fixed resistor, a differential current amplifier 133a configured to amplify a differential output of the bridge circuit 132a to control a feedback current of the feedback coil 131a, and a current-to-voltage (I-V) amplifier 134a configured to transform the feedback current into a voltage. The magnetic sensor 13b includes a feedback coil 131b disposed so as to be capable of generating a magnetic field oriented so as to cancel an induced magnetic field generated by the target current, a bridge circuit 132b including a magnetoresistive element and a fixed resistor, a differential current amplifier 133b configured to amplify a differential output of the bridge circuit 132b to control a feedback current of the feedback coil 131b, and an I-V amplifier 134b configured to transform the feedback current into a voltage. Each of the bridge circuits 132a and 132b may consist of a magnetoresistive element.

The feedback coils 131a and 131b are arranged near the magnetoresistive elements of the bridge circuits 132a and 132b, respectively. The feedback coils 131a and 131b are configured to generate a canceling magnetic field for canceling an induced magnetic field generated by a target current. Each magnetoresistive element has the property to change its resistance depending on an induced magnetic field generated by a target current. Since the above-described circuit yields an output representing the difference between the results of sending by the magnetic sensors 13a and 13b, a disturbance magnetic field, such as the geomagnetic field, applied to the magnetic sensors 13a and 13b in the same direction can be canceled out. Although FIG. 3 illustrates the magnetic balance current sensor including the magnetoresistive elements, the present invention is applicable to a magnetic proportional current sensor configured to yield a differential output of a pair of magnetic sensors and is also applicable to a current sensor including any other magnetic sensing elements.

In the current sensor with the above-described configuration, as illustrated in FIG. 2A, the second regions 121 of the bus bars 12a and 12b are arranged so as to face each other across the first region 111 of the bus bar 11. Specifically, the second regions 121 of the bus bars 12a and 12b are arranged such that the main surfaces 12c and 12d in the second regions 121 are perpendicular to the sensing axes of the magnetic sensors 13. In this case, the magnetic sensors 13 are arranged such that the sensing axes thereof are parallel to the pair of main surfaces 11a and 11b in the first region 111. In this arrangement, a magnetic field generated by a target current flowing through the first region 111 is applied to the magnetic sensors 13 such that the magnetic field is substantially parallel to the sensing axes of the magnetic sensors 13. On the other hand, a magnetic field generated by an adjacent current flowing through each second region 121 is applied to the magnetic sensors 13 such that the magnetic field is substantially orthogonal to the sensing axes of the magnetic sensors 13. Accordingly, the magnetic field (magnetic flux) generated by the adjacent current flowing through the second region 121 passes through the magnetic sensors 13 in a direction orthogonal to the sensing axes of the magnetic sensors 13. The magnetic sensors 13 therefore sense the magnetic field generated by the target current and do not sense the magnetic fields generated by the adjacent currents. Consequently, the current sensor can accurately measure the target current while reducing the effects of the magnetic fields generated by the adjacent currents. In addition, since the magnetic sensors 13 are arranged on the main surfaces 11a and 11b in the first region 111 such that the sensing axes of the magnetic sensors 13 are parallel to the main surfaces 11a and 11b, the current sensor does not require extremely highly accurate positioning and mounting of the magnetic sensors 13. Accordingly, the accuracy of measurement of the target current flowing through the bus bar 11 can be prevented from being reduced by the effects of the magnetic fields from the adjacent bus bars 12a and 12b without requiring extremely highly accurate positioning and mounting of the magnetic sensors 13. Additionally, since the sensing axes of the pair of magnetic sensors 13 are parallel to each other and a differential output of the pair of magnetic sensors 13 is obtained, a disturbance magnetic field, such as the geomagnetic field, applied to the pair of magnetic sensors 13 in the same direction can be canceled out.

In the current sensor with the above-described configuration, as illustrated in FIG. 2B, the fourth regions 122 of the bus bars 12a and 12b are arranged with the third region 112 of the bus bar 11 between the fourth regions 122. In other words, the fourth regions 122 of the bus bars 12a and 12b are arranged such that the main surfaces 12c in the respective fourth regions 122 are flush with each other. The magnetic sensors 13 are arranged in each fourth region 122 such that the sensing axes of the magnetic sensors 13 are parallel to the respective main surfaces 12c and 12d. This arrangement allows a magnetic field generated by a target current flowing through the fourth region 122 to be applied to the magnetic sensors 13 such that the magnetic field is substantially parallel to the sensing axes of the magnetic sensors 13. On the other hand, a magnetic field generated by an adjacent current flowing through the third region 112 is applied to the magnetic sensors 13 such that the magnetic field is substantially orthogonal to the sensing axes of the magnetic sensors 13. Accordingly, the magnetic field (magnetic flux) generated by the adjacent current flowing through the third region 112 passes through the magnetic sensors 13 in a direction orthogonal to the sensing axes of the magnetic sensors 13. Consequently, the magnetic sensors 13 sense the magnetic field generated by the target current and do not sense the magnetic field generated by the adjacent current. Thus, the current sensor can accurately measure each target current while reducing the effect of the magnetic field generated by the adjacent current. Since the magnetic sensors 13 are arranged on the respective main surfaces 12c and 12d in the fourth region 122 such that the sensing axes of the magnetic sensors 13 are parallel to the main surfaces 12c and 12d, the current sensor does not require extremely highly accurate positioning and mounting of the magnetic sensors 13. Accordingly, the accuracy of measurement of the target current flowing through each of the bus bars 12a and 12b can be prevented from being reduced by the effect of the magnetic field from the adjacent bus bar 11 without requiring extremely highly accurate positioning and mounting of the magnetic sensors 13. Additionally, since the sensing axes of each pair of magnetic sensors 13 are parallel to each other and a differential output of the pair of magnetic sensors 13 is obtained, a disturbance magnetic field, such as the geomagnetic field, applied to the pair of magnetic sensors 13 in the same direction can be canceled out.

Although the two bus bars 12a and 12b are arranged with the bus bar 11 therebetween in the current sensor 1 in FIG. 1, any number of bus bars may be arranged. For example, one bus bar 12 may be disposed on one side of the bus bar 11. Alternatively, a plurality of bus bars 11 and a plurality of bus bars 12 may be arranged side by side. Furthermore, although the magnetic sensor 13 is disposed in substantially central part of each of the main surfaces in the first region 111 and the fourth region 122, the magnetic sensor 13 may be disposed at any position.

As described above, according to the present embodiment, the current sensor 1 can accurately measure a target current while reducing the effect of an adjacent current without requiring extremely highly positioning and mounting of the magnetic sensors 13.

Example

Figure 4:
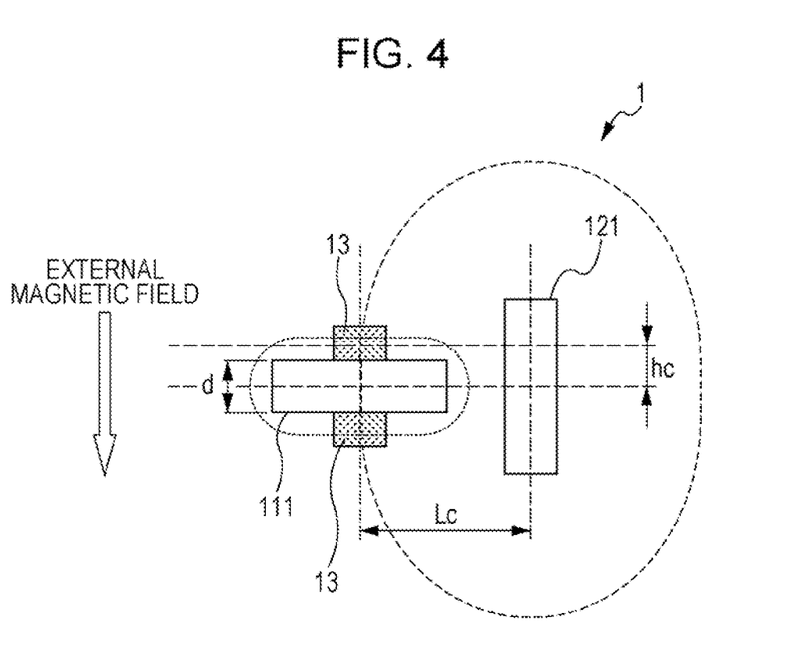
FIG. 4 is a diagram explaining the current sensor according to the embodiment.
Figure 7A:
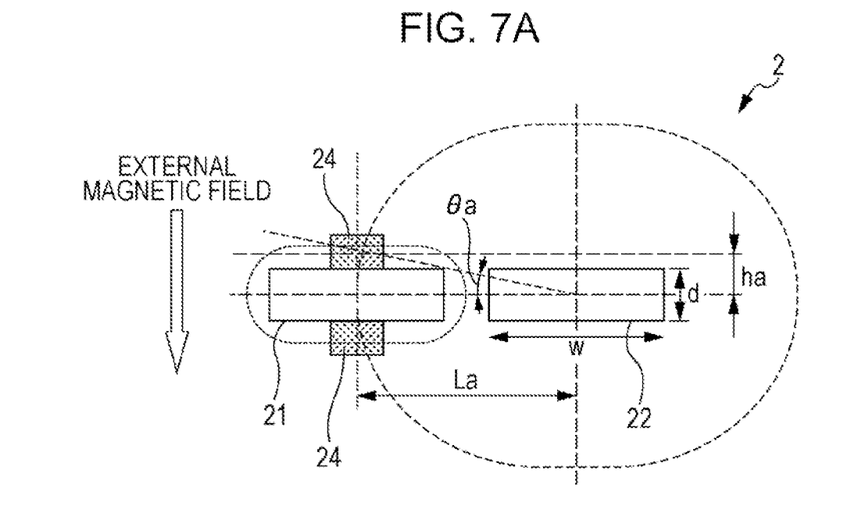
FIGS. 7A and 7B are diagrams explaining related-art current sensors.
Figure 7B:
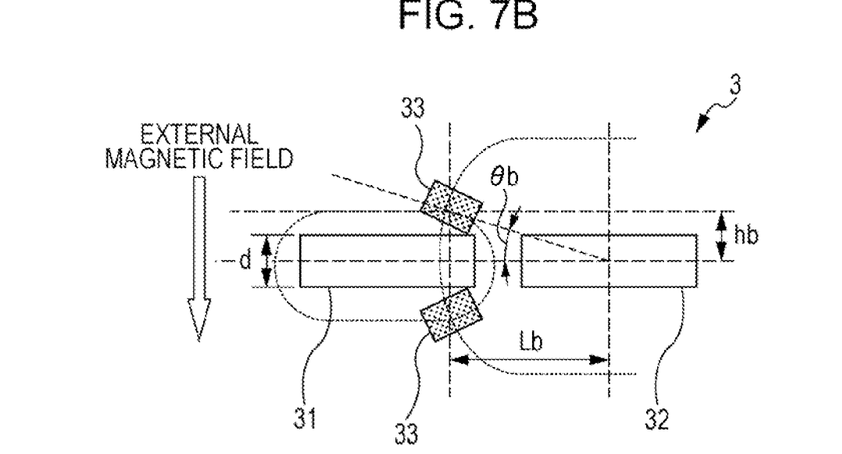

An example to demonstrate advantages of the current sensor 1 will be described below. FIG. 4 is a cross-sectional view of the current sensor 1 according to the embodiment. FIG. 7A is a cross-sectional view of a related-art current sensor 2. FIG. 7B is a cross-sectional view of another related-art current sensor 3.

In the current sensor 2 of FIG. 7A, a target current path 21 and an adjacent current path 22 each having a plate-like shape are arranged side by side on the same plane. A magnetic sensor 24 is disposed on each of a pair of main surfaces of the target current path 21. A magnetic field generated by a target current flowing through the target current path 21 is sensed by the magnetic sensors 24. In FIG. 7A, for example, the target current path 21 and the adjacent current path 22 each have a width w of 10 mm and a thickness d of 1.5 mm. A distance La between the midsection of each magnetic sensor 24 and the midsection of the adjacent current path 22 is 15 mm. Each magnetic sensor 24 is mounted on the target current path 21 such that a mounting angle θa of 11.3° is formed. The mounting angle used herein is an angle formed between a line connecting the midsection of the adjacent current path 22 to that of the magnetic sensor 24 and a line extending horizontally from the midsection of the adjacent current path 22. A height ha between the midpoint of the target and adjacent current paths 21 and 22 along the width d and the midsection of the magnetic sensor 24 is 3 mm.

In the current sensor 3 of FIG. 7B, a target current path 31 and an adjacent current path 32 each having a plate-like shape are arranged side by side on the same plane. A magnetic sensor 33 is mounted on each of a pair of main surfaces of the target current path 31 such that a mounting angle θb of 16.7° is formed. A distance Lb between the midsection of each magnetic sensor 33 and the midsection of the adjacent current path 32 is 10 mm. A height hb between the midpoint of the target and adjacent current paths 31 and 32 along the width d thereof and the midsection of the magnetic sensor 33 is 3 mm.

In the current sensor 1 of FIG. 4, the target current path 11 and the adjacent current path 12 are arranged such that the pair of main surfaces in the second region 121 of the adjacent current path 12 are perpendicular to the pair of main surfaces in the first region 111 of the target current path 11. The magnetic sensors 13 are arranged on the respective main surfaces in the first region 111 such that a main surface of each magnetic sensor 13 is in contact with the corresponding main surface. A distance Lc between the midsection of each magnetic sensor 13 and the midsection in the second region 121 (of the adjacent current path 12) is 10 mm. A height hc between the midpoint in the first and second regions 111 and 121 (of the target and adjacent current paths 11 and 12) along the width d thereof and the midsection of the magnetic sensor 13 is 3 mm.

For convenience of explanation, the relationship between the first region 111 and the second region 121 provided that the current path 11 is a target current path and the current path 12 is an adjacent current path has been described above with reference to FIG. 4. The same applies to the relationship between the fourth region 122 and the third region 112 provided that the current path 12 is a target current path and the current path 11 is an adjacent current path.

Figure 5A:
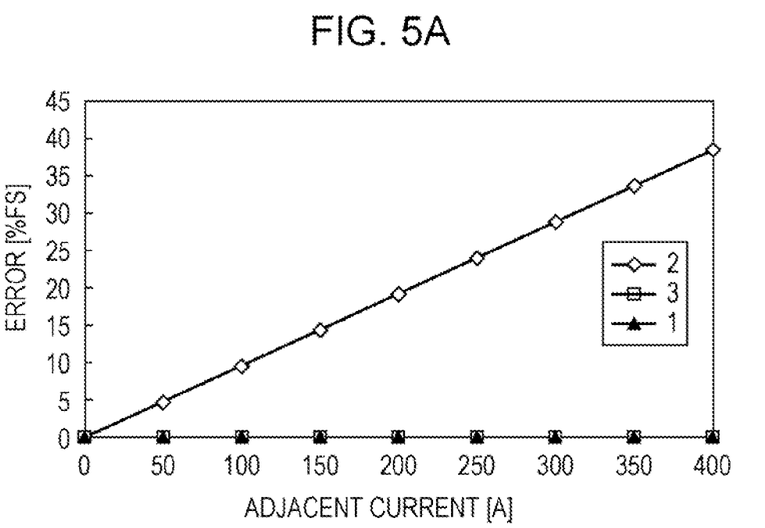
FIGS. 5A and 5B are graphs illustrating an evaluation of the current sensor according to the embodiment and evaluations of related-art current sensors.

Measurement errors in measured target currents in the above-described current sensors 1 to 3 will be described in detail below. FIG. 5A is a graph illustrating the relationship between the adjacent current and the measurement error in each of the current sensors 1 to 3 illustrated in FIGS. 4, 7A, and 7B. The measurement error was obtained as the ratio of components of a magnetic field generated by the adjacent current and an external magnetic field in the direction along the sensing axes to the full scale magnetic field generated by the target current.

As described above with reference to FIG. 7A, in the current sensor 2, the magnetic field generated by the adjacent current flowing through the adjacent current path 22 includes a component parallel to the sensing axes of the magnetic sensors 24 mounted on the target current path 21. Accordingly, the effect of the adjacent current caused a measurement error in measured target current flowing through the target current path 21 in the current sensor 2. As illustrated in FIG. 5A, therefore, as the adjacent current increased, the measurement error in measured target current in the current sensor 2 also increased. For example, when the full scale adjacent current was 400 A, a maximum measurement error of 38% in measured target current was caused in the current sensor 2.

As described above with reference to FIG. 7B, in the current sensor 3, the magnetic field generated by the adjacent current flowing through the adjacent current path 32 is orthogonal to the sensing axes of the magnetic sensors 33 mounted on the target current path 31 with the mounting angle θb. Accordingly, the current sensor 3 can measure the target current without being affected by the adjacent current. As illustrated in FIG. 5A, therefore, when the adjacent current increased, any measurement error in measured target current was not caused in the current sensor 3.

As described above with reference to FIG. 4, in the current sensor 1, the magnetic field generated by the adjacent current flowing through the second region 121 of the adjacent current path 12 is orthogonal to the sensing axes of the magnetic sensors 13 mounted on the first region 111 of the target current path 11. Accordingly, the current sensor 1 can measure the target current without being affected by the adjacent current. As illustrated in FIG. 5A, therefore, when the adjacent current increased, any measurement error in measured target current was not caused in the current sensor 1.

Figure 5B:
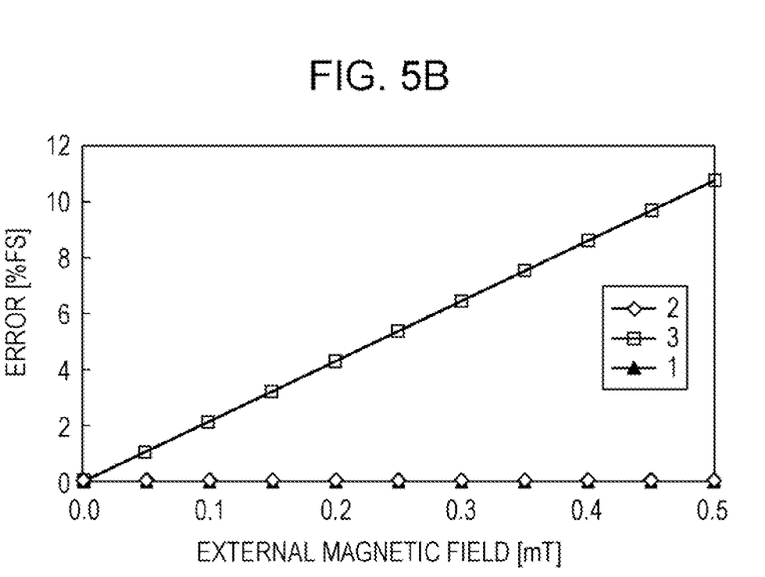

FIG. 5B is a graph illustrating the relationship between the external magnetic field and the measurement error in each of the current sensors 1 to 3 illustrated in FIGS. 4, 7A, and 7B. In the current sensor 3 of FIG. 7B, each magnetic sensor 33 is mounted with the mounting angle θb. Assuming that the external magnetic field is oriented parallel to the direction along the thickness d of the target and adjacent current paths 31 and 32, the external magnetic field includes a component parallel to the sensing axes of the magnetic sensors 33. Accordingly, the external magnetic field allowed the current sensor 3 to cause a measurement error in measured target current flowing through the target current path 31. As illustrated in FIG. 5B, therefore, as the external magnetic field increased, the measurement error in measured target current in the current sensor 3 increased. For example, when the external magnetic field was 0.05 mT, a measurement error of approximately 1% in measured target current was caused in the current sensor 3.

As described above with reference to FIG. 7A, in the current sensor 2, assuming that the external magnetic field is parallel to the direction along the thickness d of the target and adjacent current paths 21 and 22, the external magnetic field is orthogonal to the sensing axes of the magnetic sensors 24. Accordingly, the current sensor 2 can measure the target current flowing through the target current path 21 without being affected by the external magnetic field. As illustrated in FIG. 5B, therefore, when the external magnetic field increased, any measurement error in measured target current was not caused in the current sensor 2.

As described with reference to FIG. 4, in the current sensor 1, assuming that the external magnetic field is parallel to the direction along the thickness d of the target current path 11 in the first region 111, the external magnetic field is orthogonal to the sensing axes of the magnetic sensors 13. Accordingly, the current sensor 1 can measure the target current flowing through the first region 111 without being affected by the external magnetic field. As illustrated in FIG. 5B, therefore, when the external magnetic field increased, any measurement error in measured target current was not caused in the current sensor 1.

As described above, in the current sensor 1 according to the embodiment, the second region 121 or the third region 112, serving as an adjacent region in the adjacent current path, is disposed such that the magnetic field generated by the adjacent current is orthogonal to the sensing axes of the magnetic sensors 13. If the adjacent current increases as illustrated in FIG. 5A, therefore, any measurement error in measured target current is not caused. Since the magnetic sensors 13 are in contact with the pair of main surfaces in the first region 111 or the fourth region 122 which serves as a target section in the target current path, so long as an external magnetic field is parallel to the direction along the thickness d of the target current path, any measurement error in measured target current is not caused even if the external magnetic field increases, as illustrated in FIG. 5B. In other words, the current sensor 1 according to the embodiment did not cause a measurement error in measured target current in each of FIGS. 5A and 5B.

In the current sensor 1 according to the embodiment, therefore, the effect of a magnetic field from the adjacent current path can be reduced and the accuracy of measurement of a target current can be accordingly increased as compared with, for example, the current sensor 2 of FIG. 7A. Additionally, the effect of an external magnetic field can be reduced and the accuracy of measurement of a target current can be accordingly increased as compared with, for example, the current sensor 3 of FIG. 7B.

In the current sensor 1 according to the embodiment, the target current path and the adjacent current path are arranged such that while the main surfaces of the magnetic sensors 13 are in contact with the pair of main surfaces of the target current path, a magnetic field generated from the adjacent current path is orthogonal to the sensing axes of the magnetic sensors 13. Accordingly, the effect of the magnetic field from the adjacent current path can be eliminated. Consequently, the effect of the magnetic field from the adjacent current path can be eliminated without requiring highly accurate positioning and mounting of the magnetic sensors 13, as in the case of the current sensor 3 of FIG. 7B.

The present invention is not limited to the above-described embodiment and various modifications may be implemented. For example, although the above-described embodiment has been described with respect to the case where the sensing axes of the magnetic sensors arranged on the respective main surfaces in each of the first region 111 and the fourth region 122 are parallel to each other, the sensing axes may be antiparallel to each other.

As described above, the arrangement of the components and the sizes of the components in the above-described embodiment may be appropriately modified and implemented. Furthermore, the present invention may be appropriately modified and implemented without departing from the spirit and scope of the invention.

INDUSTRIAL APPLICABILITY

The current sensor according to the present invention can be used to sense the magnitude of current for driving a motor of an electric car or a hybrid car, for example.

What is claimed is:

1. A current sensor comprising:
a first current path having a pair of main surfaces, the first current path including a first region and a third region between which the first current path is twisted, each of the first and third regions having a plate-like shape;
a second current path parallel to the first current path, the second current path having a pair of main surfaces, and including a second region and a fourth region between which the second current path is twisted, each of the second and fourth regions having a plate-like shape;
a pair of first magnetic sensors arranged in the first region on the respective main surfaces therein such that the pair of first magnetic sensors have respective sensing axes parallel to each other and also parallel to the respective main surfaces in the first region, the pair of first magnetic sensors being configured to sense a magnetic field generated by a target current flowing through the first region; and
a pair of second magnetic sensors arranged in the fourth region on the respective main surfaces therein such that the pair of second magnetic sensors have respective sensing axes parallel to each other and also parallel to the respective main surfaces in the fourth region, the pair of second magnetic sensors being configured to sense a magnetic field generated by a target current flowing through the fourth region,
wherein the main surfaces in the second region are perpendicular to the sensing axes of the pair of first magnetic sensors, and the main surfaces in the third region are perpendicular to the sensing axes of the pair of second magnetic sensors.

2. The current sensor according to claim 1, wherein the second region has a width greater than a distance between the pair of first magnetic sensors.

3. The current sensor according to claim 1, wherein the main surfaces of the first and second current paths are parallel to one another at a mounting position.

4. The current sensor according to claim 3,
wherein the first current path is twisted such that the main surfaces in the third region are oriented at 90° relative to the main surfaces in the first region, and
wherein the second current path is twisted such that the main surfaces in the fourth region are oriented at 90° relative to the main surfaces in the second region.

5. The current sensor according to claim 4, further comprising another second current path so as to have a pair of second paths with the first current path arranged therebetween,
wherein the main surfaces in the second regions of the pair of second current paths are arranged so as to face each other across the first region of the first current path, and
wherein the main surfaces in the fourth regions of the pair of second current paths are arranged so as to be flush with each other, the third region of the first current path being interposed between the main surfaces in the fourth regions of the pair of second current paths.

6. The current sensor according to claim 1, wherein the third region has a width greater than a distance between the pair of second magnetic sensors.

\* \* \* \* \*